United States Patent [19]
Koglin et al.

[11] Patent Number: 6,011,422
[45] Date of Patent: Jan. 4, 2000

[54] INTEGRATED DIFFERENTIAL VOLTAGE AMPLIFIER WITH PROGRAMMABLE GAIN AND INPUT OFFSET VOLTAGE

[75] Inventors: Dennis Michael Koglin, Carmel; Robert Harrison Reed, Kokomo, both of Ind.

[73] Assignee: Delco Electronics Corporaiton, Kokomo, Ind.

[21] Appl. No.: 09/113,525

[22] Filed: Jul. 10, 1998

[51] Int. Cl.[7] .................................. G01L 9/06; H03K 3/42
[52] U.S. Cl. ..................... 327/357; 327/513; 327/362; 327/563
[58] Field of Search ................................ 327/100, 513, 327/362, 512, 103, 563, 77, 357

[56] References Cited

U.S. PATENT DOCUMENTS

| | | | |
|---|---|---|---|
| 4,883,992 | 11/1989 | Koglin et al. | 327/513 |
| 5,313,121 | 5/1994 | Cianci et al. | 327/103 |
| 5,534,816 | 7/1996 | Koglin et al. | 327/513 |
| 5,619,122 | 4/1997 | Kearney et al. | 323/312 |

*Primary Examiner*—Dinh T. Le
*Attorney, Agent, or Firm*—Jimmy L. Funke

[57] ABSTRACT

A multiplier and corresponding method are provided for amplifying a voltage difference between a first input voltage and a second input voltage, the multiplier being implemented with Bipolar Junction Transistor technology having high emitter resistance. The multiplier includes a first bipolar input transistor having high emitter resistance that receives the first input voltage and a second bipolar input transistor having high emitter resistance that receives the second input voltage. The multiplier also includes a first current source for generating a first current that flows through said first bipolar input transistor, a current mirror for producing a second current that is substantially equal to said first current and flows through said second bipolar input transistor. A range select impedance forms a first voltage loop with said first bipolar input transistor and said second bipolar input transistor and translates the voltage difference between the first input voltage and the second input voltage into a differential current. The differential current varies said second current and alters a base-to-emitter voltage of said second bipolar input transistor. A second voltage loop is provided that includes said second bipolar input transistor, the second voltage loop providing a relationship between said base-to-emitter voltage of said second bipolar input transistor and a multiplier current that represents the difference between the first input voltage and the second input voltage.

5 Claims, 3 Drawing Sheets

INTEGRATED DIFFERENTIAL VOLTAGE AMPLIFIER WITH PROGRAMMABLE GAIN AND INPUT OFFSET VOLTAGE

BACKGROUND OF THE INVENTION

1. Field of the Invention

The present invention relates to an integrated differential voltage amplifier with programmable gain and input offset voltage that has the ability to sense negative differential inputs and, more particularly, to a multiplier for amplifying a voltage difference that is implemented with Bipolar Junction Transistor (BJT) technology having high emitter resistance.

2. Description of Background Art

Transducers are commonly used to produce electrical signals in response to a force and may be configured to sense pressure or motion/acceleration. A piezoresistive transducer is conventionally configured with strain sensing elements and fabricated on a semi-conductor chip. Since piezoresistive transducers are generally known to produce very small outputs, amplification is often necessary.

Amplification is generally accomplished with specialized amplifiers, and integrated amplifier circuits are commonly employed. The transducer and integrated amplifier combination is generally calibrated during a qualification cycle in which an initial gain and offset are selected in order to produce a compensated calibrated output voltage. Often, these integrated amplifiers and transducers are subject to operating temperature variations which effect the overall operational characteristics of the system. For example, operating temperature variations may affect the output of the transducer and, in turn, affect the gain and offset of the integrated amplifier circuit, thereby resulting in an uncompensated output signal which may result in an inaccurate reading.

Prior to the present invention, voltage signals from a sensing chip were converted to current and then amplified using low impedance bipolar transistors. Such transistors could easily be made by conventional bipolar transistor processing, and any trimming that needed to be done for temperature compensation could be done off-chip by laser abrasion or on-chip by zener zapping. The voltage-to-current conversion was done by one circuit part and the amplification by another. Other aspects of signal conditioning were done by other circuit parts on the same IC chip, or on another IC chip.

The bipolar transistors made with conventional bipolar processing typically have low emitter impedances, i. e., significantly less than 10 ohms. Prior signal conversion and amplification could be easily done without introducing problems due to temperature variation. In addition, offset, if needed, could be done by adjusting the voltage to the input converter.

This invention involves converting a voltage signal into a current signal using bipolar transistors, and concurrently amplifying the signal. In addition, the conversion and amplification is done without introducing added variation in current with temperature. However, the bipolar transistors utilized are not the typical low emitter impedance bipolar transistors that have emitter impedances of less than 10 ohms. The emitter impedances of these high emitter impedance bipolar transistors are about 10–40 ohms.

The reason the bipolar transistors have such a high emitter resistance is because they are not made with a typical bipolar or biCMOS process. Instead, they are made using some of the same process steps that are ordinarily used to make CMOS transistors. Making the bipolar transistors using only the CMOS process steps, instead of adding steps especially for the bipolar transistors, results in manufacturing benefits. However, these benefits are offset by a resulting higher emitter resistance e. g., about 10–40 ohms, in the bipolar transistors that are formed. The higher emitter resistances in such bipolar transistors introduces a temperature variation aggravation (and nonlinearity) in the voltage to current conversion and subsequent current amplification.

This invention uses such high emitter resistance transistors for the sensed voltage conversion and amplification, while minimizing temperature variation effects. The conversion and amplification is performed with a circuit that integrates both the conversion and amplification functions. Offset is also done in a distinctive manner. As a result, the manufacturing benefits of making the bipolar transistors using only CMOS process steps can be realized, while avoiding the circuit performance disadvantages attributable to the higher emitter resistance bipolar transistors that result.

In view of the foregoing, it is an object of the present invention to provide an integrated differential voltage amplifier having programmable gain and input offset voltage that is able to sense positive and negative differential inputs. Furthermore, a multiplier is provided for amplifying a voltage difference using Bipolar Junction Transistor technology having high emitter resistance.

SUMMARY OF THE INVENTION

The present invention provides a multiplier for amplifying a voltage difference between a first input voltage and a second input voltage, the multiplier being implemented with Bipolar Junction Transistor technology having high emitter resistance. The multiplier includes a first bipolar input transistor having high emitter resistance that receives the first input voltage and a second bipolar input transistor having high emitter resistance that receives the second input voltage. The multiplier also includes a first current source for generating a first current that flows through said first bipolar input transistor, a current mirror for producing a second current that is substantially equal to said first current and flows through said second bipolar input transistor and a range select impedance that forms a first voltage loop with said first bipolar input transistor and said second bipolar input transistor and translates the voltage difference between the first input voltage and the second input voltage into a differential current. The differential current varies said second current and alters a base-to-emitter voltage of said second bipolar input transistor. A second voltage loop is provided that includes said second bipolar input transistor, said second voltage loop providing a relationship between said base-to-emitter voltage of said second bipolar input transistor and a multiplier current that represents said difference between said first input voltage and said second input voltage.

Further scope and applicability of the present invention will become apparent from the detailed description given herein. However, it should be understood that the detailed description of the preferred embodiment of the present invention is given by way of illustration only, since various changes and modifications within the spirit and scope of the invention will become apparent to those skilled in the art.

BRIEF DESCRIPTION OF THE DRAWINGS

Other objects and advantages of the invention will become apparent upon reading the following detailed description and upon reference to the following drawings in which.

DETAILED DESCRIPTION OF THE PREFERRED EMBODIMENT

The following description of the preferred embodiment is mainly exemplary in nature and is no way intended to limit the invention or its application or uses.

In sensor conditioning circuits, it is often necessary to sense small differential voltages that require amplification and compensation for temperature effects. The relation between the amplification, compensation, and the resulting single ended output voltage ($V_{out}$) representing the difference between two input signals is as follows:

$$V_{out}=[G(T)*((S+-S-)+V(X)+V(T)] \quad (1)$$

where: G(T) is an adjustable common temperature dependent gain;

(S+–S–) is a differential input voltage from the sensing element;

V(X) is an adjustable, temperature independent offset voltage; and

V(T) is an adjustable, temperature dependent offset voltage.

The differential input signal (S+–S–) of equation (1) is composed of two components. The first component is generally the most significant in magnitude, proportional to applied pressure and supply voltage, and extremely temperature dependent. The second component is a temperature independent offset voltage which is inherent to any wheatstone bridge resistor configuration.

For sensing elements where this offset voltage is excessive, an input offset adjustment is required. If not, large temperature dependencies would be added to the transducer output as a result of the sensing element offset being multiplied by the temperature dependent circuit gain. This adjustable offset is represented by the V(X) term of equation (1).

Since the V(X) adjustment is a very crude adjustment, an additional temperature adjustment in the form of a temperature dependent offset must be generated to compensate for residual portions of sensing element offset not eliminated by the V(X) adjustment. This is represented by the V(T) term of equation (1). This temperature dependent offset compensation technique is discussed in U.S. Pat. No. 5,534,816, entitled "Programmable Transducer Amplifier Circuit", which is hereby incorporated by reference.

The G(T) term of equation (1) is the temperature dependent circuit gain. This term is linearly dependent upon temperature and is adjustable at two temperatures. When properly calibrated, the product of the circuit gain G(T) and the sensing element pressure sensitivity is temperature independent.

Figure 1:
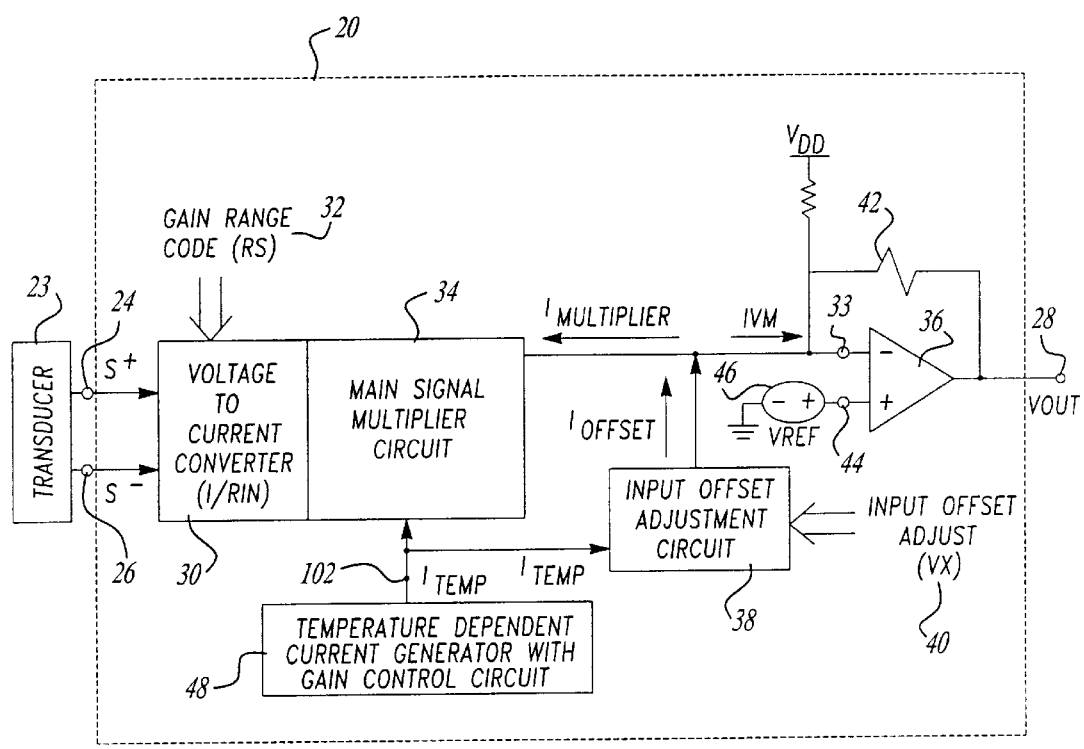
FIG. 1 is a block diagram of the integrated differential voltage amplifier with programmable gain and input offset voltage of the preferred embodiment of the present invention.

FIG. 1 shows a block diagram illustrating an integrated differential voltage amplifier 20 according to a preferred embodiment of the present invention. This circuit 20 provides amplification with temperature compensation by converting the differential input voltage to a current, multiplying the current and subsequently providing additional amplification multiplying this current by a ratio of currents that introduce the temperature compensation effects of G(T). The resulting current is then converted to a single ended voltage ($V_{out}$) for post processing.

In this description, the amplifier 20 is receiving two input voltages from a transducer 23. Specifically, the two input voltages are received at a first input terminal (S+) 24 and a second input terminal (S–) 26. The input terminals (24, 26) maybe connected to a wide variety of electrical devices that produce small voltages for which a differential voltage is to be measured and amplified. The amplifier 20 provides programmable gain and input offset voltage and amplifies the differential voltage such that a compensated calibrated single-ended output voltage ($V_{out}$) is generated at output line 28.

The amplifier 20 is adapted to be used in a vehicle (not shown), such as an automobile. More particularly, this invention may be used in amplifying and conditioning signals from a pressure transducer or a motion/accelerometer transducer or other similar sensing device. However, it is to be understood that the use of this invention is not restricted to automobiles, amplifiers, transducers or sensors, but could have other uses in other applications requiring signal conditioning.

As can be seen in FIG. 1, the amplifier 20 includes an integrated voltage-to-current converter circuit 30 and main signal multiplier circuit 34 formed with Bipolar Junction Technology (BJT) having high emitter resistances (in excess of 10 ohms), that receives the two input voltages presented to the first input terminal (S+) 24 and second input terminal (S–) 26. The potential difference between the two input voltages is converted to a single current by the converter circuit 30 based upon a selected gain range that is chosen via a gain range code (RS) 32.

The selection of the gain range code has two major implications. First, it limits the current swing in the voltage-to-current converter circuit 30, thereby minimizing nonlinearity in the multiplier. Second, dividing the total gain range into multiple ranges improves the balance of the least significant trim bit's effect on gain across the entire calibration range.

The voltage-to-current converter circuit 30 and main signal multiplier circuit 34 produces a multiplier current ($I_{multiplier}$). The multiplier current ($I_{multiplier}$) is one component of the resultant current ($I_{VM}$) presented to an inverting input (–) 33 of an operational amplifier 36. The resultant current ($I_{VM}$) also includes an input offset adjustment current ($I_{offset}$) generated by the input offset adjust circuit 38 utilizing a selectable input offset adjust ($V_x$) 40.

The resultant current ($I_{VM}$) is converted to the single-ended output voltage ($V_{out}$) with the operational amplifier 36 configured such that the inverting input (–) 33 is coupled to the output line 28 via a feedback resistor ($R_f$) 42, and the non-inverting input (+) 44 is presented a reference voltage ($V_{ref}$) 46. As can be appreciated, with this amplifier configuration, the gain and offset of the operational amplifier 36 are established via control of the inverting input (–) 33.

As previously indicated, the resultant current ($I_{VM}$) received at the inverting input (–) 33 of the operational amplifier 36 is the sum of the multiplication current ($I_{multiplier}$) generated by the main signal multiplier circuit 34 and the offset current ($I_{offset}$) produced by the input offset adjustment circuit 38. The multiplication current ($I_{multiplier}$) and offset current ($I_{offset}$) are generated based upon a temperature dependent gain current ($I_{temp.}$) provided by a temperature dependent current generator with gain control circuit 48.

The current $I_{temp}$ has the functional form of:

$$I_{temp}=I_G*(1+KX*(T-T_N)) \qquad (2)$$

where: $I_G$=gain control current at temperature $T_N$, adjustable at the primary trim temperature $T_N$; T=conditioning IC temperature; and KX=TC gain parameter, adjustable at the secondary trim temperature. It should be noted that at the primary trim temperature (TN), the effect of the secondary trim parameter (KX) has been nulled or removed from equation (2). $I_{temp}$ is the preferred function compensating for the temperature dependent sensitivity of piezoresistive pressure sensing elements. It is essential that the adjustment of the gain parameter KX at the secondary trim temperature does not affect the value of the gain control current at the primary trim temperature (TN). The implication here is that adjusting the transducer gain, via the gain control current, to equal the desired gain at two different temperatures, will force the transducer gain to equal the desired value at all temperatures. This would not be true without the decoupling of the two gain calibrations. This technique is described in U.S. Pat. No. 5,534,816, entitled "Programmable Transducer Amplifier Circuit," which is hereby incorporated by reference.

Figure 2A:
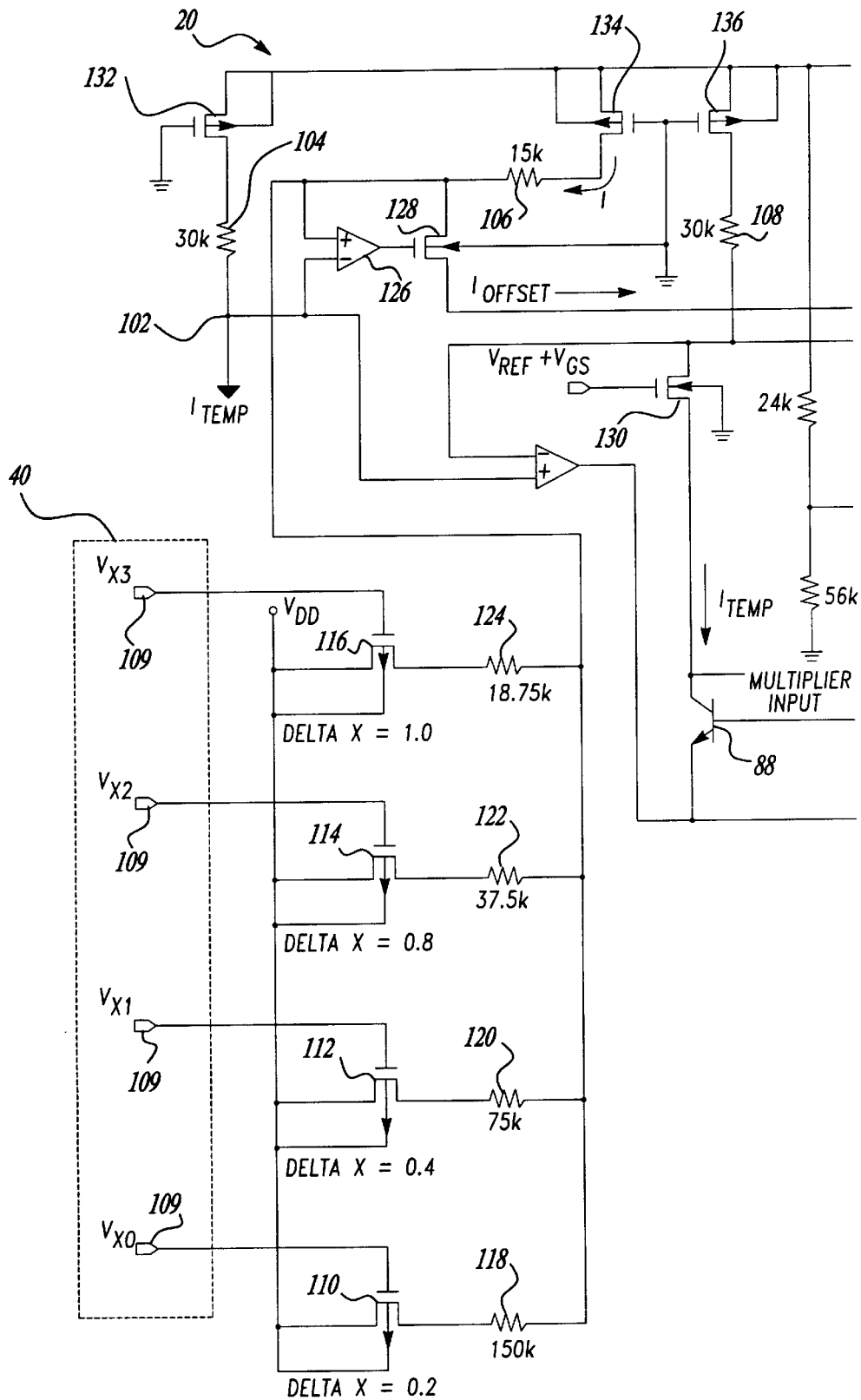
FIG. 2(A–B) is a circuit diagram illustrating the integrated differential voltage amplifier with programmable gain and input offset voltage of FIG. 1, in further detail.
Figure 2B:
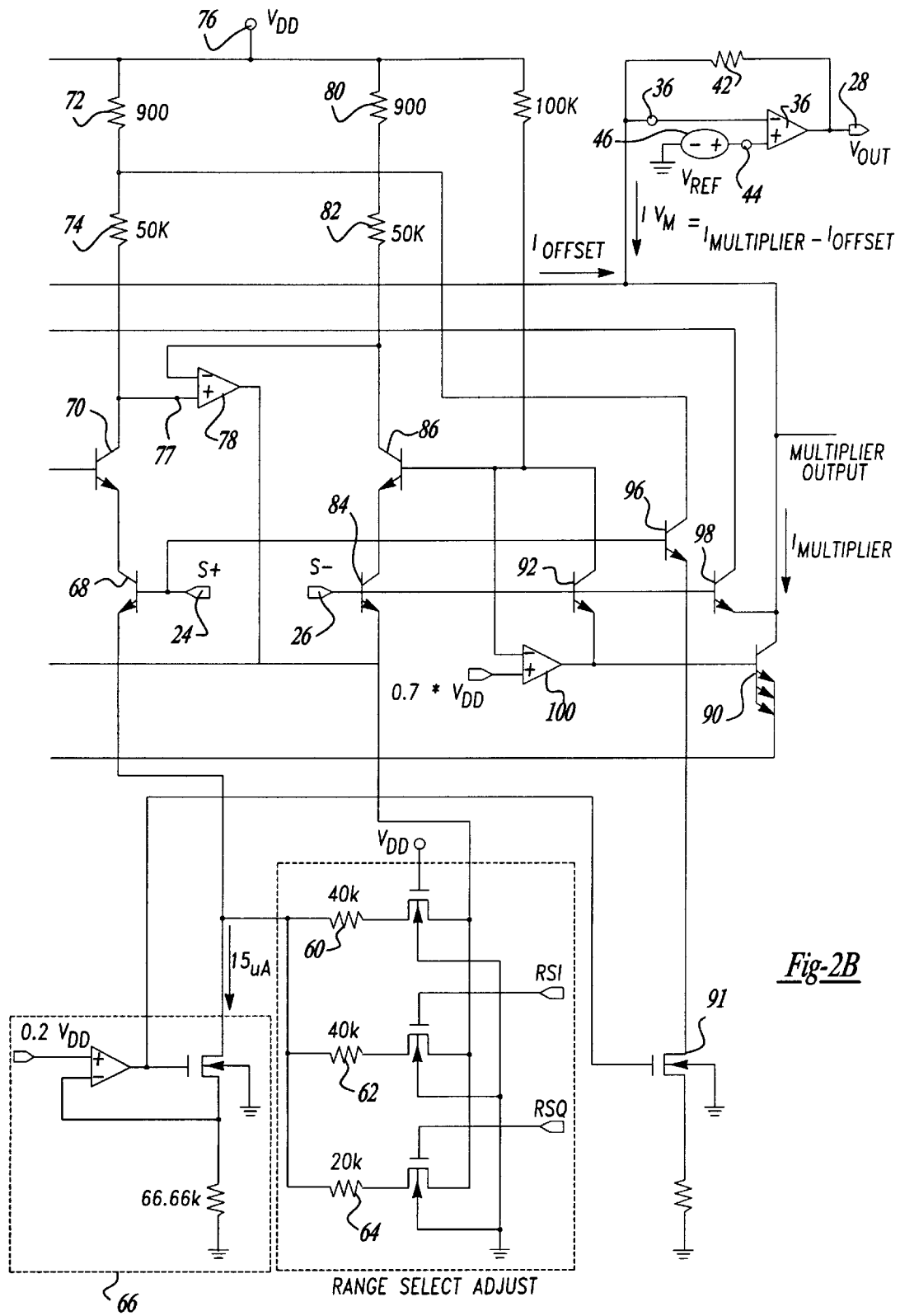

FIG. 2(A–B) provides the integrated differential voltage amplifier 20 in further detail. Initially, the assumption will be made that the voltage applied at the first input terminal (S+) 24 is equal to the voltage applied at the second input terminal (S–) 26. Furthermore, the assumption will be made that if the same potential is applied at the first and second input terminals (24, 26), no current will flow through the first range select adjust resistor 60, second range select adjust resistor 62 and third range select adjust resistor 64, or any combination thereof. With these assumptions, it can be seen that the 15 μA current generated by the first current source 66 flows through the first positive input transistor 68, second positive input transistor 70, resistor 72 and resistor 74.

Due to the current flow from the voltage supply ($V_{DD}$) 76, a voltage drop will exist across the resistor 72 and resistor 74. As the voltage at the low side of the resistor 74 is presented to the positive input terminal 77 of a mirroring amplifier 78, the voltage drop across the resistor 80 and resistor 82 will be equal to the previously described voltage drop across the resistor 72 and resistor 74. In effect, this configuration provides a current mirror. However, it should be readily apparent that a current mirror may be implemented in alternate forms. Polysilicon resistors were chosen to produce the current mirroring because a configuration which uses p-channel transistors would be less stable over thermal cycles that pressure transducers are subjected to during normal operation.

Because the current flowing through resistor 80 and resistor 82 is mirroring the current flowing through resistor 72 and resistor 74, the same current flowing through first positive input transistor 68 and second positive input transistor 70 is flowing through the first negative input transistor 84 and second negative input transistor 86. This current will sink into the output of the mirroring amplifier 78 as the current will flow through the emitter of the first negative input transistor 84 and into the output of the mirroring amplifier 78. Furthermore, because of the same current flow through the first positive input transistor 68 and first negative input transistor 84, the base-to-emitter voltage of the first positive input transistor 68 and first negative input transistor 84 must be the same. Therefore, it can be seen that the initial assumption of no current flow through the first, second, and third range select adjust resistors (60, 62, 64) is met for equal potentials applied to the first input terminal (S+) 24 and second input terminal (S–) 26.

It should be understood that the second negative input transistor 86 maintains like current as in the first negative input transistor 84 and first voltage loop transistor 92 when the voltage at the first input terminal (S+) 24 is equal to the voltage at the second input terminal (S–)26. When the voltages presented to these two input terminals are equal the current in the first negative input transistor 84 is equal to the current generated by the current source 66 minus a base current which was lost when this current past through the first positive input transistor 68. As a result of the second negative input transistor 86, the current in the first voltage loop transistor 92 is also equal to 15 μA minus the base current from the second negative input transistor 86. Because base currents are highly temperature dependent, without the second negative input transistor, a large nonlinear temperature dependent offset would be produced at the transducer output. Further, the second negative input transistor 86 maintains the same supply dependence for the collector to emitter voltage of the first negative input transistor as there is at the first voltage loop transistor 92. Once again, this maintains supply independence for the multiplier which is required for supply ratiometricity. It should also be noted that the second positive input transistor 70 is present to maintain the same collector current and voltage at the first positive input transistor 68 as there is at the second positive input transistor 84.

As the potentials presented to the first input terminal (S+) 24 and second input terminal 26 (S–) differ, either where the voltage at the first input terminal (S+) 24 is greater than the voltage at the second input terminal (S–) 26 or the voltage at the second input terminal (S–) 26 is greater than the voltage at the first input terminal (S+) 24, the voltage difference is translated across the selected combination of the first, second and third range select adjust resistors (60, 62, 64). This can also be seen as a voltage loop consisting of the base-to-emitter voltage of the first positive input transistor 68, the selected range adjust resistors (60, 62, 64) or combination thereof, and the base-emitter voltage of the first negative input transistor 84. Therefore, the amount of current that flows through the range select adjust resistors (60, 62, 64) will compensate for the difference that is forced across the first input terminal (S+) 24 and second input terminal (S–) 26.

As a voltage difference is forced across the range select adjust resistors (60, 62, 64), a current is generated that will either add or subtract from the current generated by the first current source 66. Therefore, a current will flow with a magnitude that will vary based upon the potential difference presented at the two input terminals (24, 26). More specifically, a difference between the voltages presented to the input terminals (24, 26) translates in a change to the base-to-emitter voltage of the first negative input transistor 84 such that if the potential seen at the first input terminal (S+) 24 is greater than the potential seen at the second input terminal (S–) 26, more current will flow through the current mirror and the base-to-emitter voltage of the first negative input transistor 84 will increase. Conversely, if the potential seen at the second input terminal (S–) 26 is greater than the potential seen at the first input terminal (S+) 24, the opposite will occur and the base-to-emitter voltage of the first negative input transistor 84 will decrease in a controlled manner so that the base-to-emitter voltage of the first negative input transistor 84, that is tied into the first voltage loop transistor, provides a current that varies based upon the differential input, flowing from the multiplier input transistor 88 to the multiplier output transistor 90.

The change in the base-to-emitter voltage of the first negative input transistor 84 is basically the result of the voltage-to-current conversion of the two input voltages presented at the input terminals (24,26). The current in the first positive input transistor 68 increases or decreases as a result of changes in the voltages applied to the input terminals (24,26). The mirroring action of the mirroring amplifier 78 reflects this change into the first negative input transistor 84. The resulting base-to-emitter voltage change in the first negative input transistor 84, which is one of the four multiplier transistors, is reflected in a change to the multiplier output transistor 90.

The multiplier input transistor 88 and multiplier output transistor 90 in conjunction with the first negative input transistor 84 and a first voltage loop transistor 92, form a voltage loop that provides a relationship to the base-to-emitter voltage of the first negative input transistor 84 and the collector current of the multiplier output transistor 90. The voltage loop consists of the base-to-emitter voltage of the multiplier input transistor 88, the base-to-emitter voltage of the first negative input transistor 84, the base-to-emitter drop of the voltage loop transistor 92, and finally to the base-to-emitter voltage of the multiplier output transistor 90.

As the base-to-emitter voltage of the multiplier input transistor 88 is a fixed quantity based upon the temperature dependent current ($I_{temp}$) injected into the collector of this transistor, and the base-to-emitter voltage of the voltage loop transistor 92 is a fixed quantity due to the presence of the amplifier 100, the only degree of freedom in this voltage loop is in the multiplier output transistor 90 (i.e., a change in the base-to-emitter voltage of the first negative input transistor 84 must translate to a change in the multiplier output transistor 90 as the multiplier input transistor 88 and the voltage loop transistor 92 are fixed). It should be apparent that the configuration formed by these four transistors produces a known relationship in the transistor currents. More specifically, the collector current of the multiplier input transistor 88 multiplied by the collector current of the first negative input transistor 84 equals the product of the collector current from the voltage loop transistor 92 and the multiplier output transistor 90.

A start up transistor 96 is connected to the first input terminal (S+) 24 to balance the amount of base current loading occurring at the first input terminal (S+) 24, thereby matching the base current loading at the second input terminal (S−) 26. In other words, because the second input terminal (S−) has the first negative input transistor 84 and voltage loop transistor 92 pulling base current out of that second input terminal (S−) 26, and the first positive input transistor 68 has a single transistor load, the start up transistor 96 is added so that the amount of base current removed from the first input terminal (S+) 24 is substantially equal to the amount of base current being pulled out of the second input terminal (S−) 26.

Because the first negative input transistor 84 has a bi-stable state, the start up transistor 96 is provided in order to also force the non-inverting terminal of the mirroring amplifier 78 to be lower than the inverting terminal, thereby forcing output of the mirroring amplifier 78 to turn on the first negative input transistor 84 under all conditions.

The latch prevention transistor 98 is also present to prevent a latch condition in the circuit. More specifically, the latch prevention transistor 98 is present to prevent a bi-stable mode of operation for the op amp 100. Without the latch prevention transistor 98 the multiplier output transistor 90 is able to saturate. If the multiplier output transistor 90 is allowed to saturate, a parasitic substrate pnp transistor present at the base of the multiplier output transistor 90 will cause excessive current to be extracted from the voltage loop transistor 92 and the op amp 100. This makes the multiplier insensitive to S+ and S− voltage changes. With the latch prevention transistor 98 present, the multiplier output transistor 90 cannot saturate. When the multiplier output transistor 90 begins to saturate, the latch prevention transistor 98 turns on an diverts current away from the collector of the multiplier input transistor 88. When the current of the multiplier input transistor 88 decreases, so does the current in the multiplier output transistor 90. This is true because the multiplier output transistor 90 is dependent on the multiplier input transistor 88. With the current of the multiplier output transistor 90 reduced, the latch prevention transistor 98 responds by turning off and returning the circuit to normal operation. In other words, the latch prevention transistor 98 clamps the collector of the multiplier output transistor 90 at one diode drop below S−.

Transistor 91 provides a supply dependent bias current of 15 $\mu$A to the multiplier start up transistor 96. Since this is the source of the multiplier startup current, it must be independent of multiplier operation.

As previously indicated, the temperature dependent gain current ($I_{temp}$) is generated by the temperature dependent current generator with gain control circuit and provided to both the input offset adjustment circuit and main signal multiplier circuit. The temperature dependent gain control current ($I_{temp}$) is provided at input node 102 and mirrored for both gain control and input offset adjustment. Specifically, the $I_{temp}$ current going through resistor 104 is mirrored through resistor 106 for offset and resistor 108 for gain.

The mirrored $I_{temp}$ current that is flowing through the resistor 106 is adjusted based upon the input offset adjust ($V_x$) 40. This is accomplished through application of offset voltage bits ($V_{x0}$, $V_{x1}$, $V_{x2}$, $V_{x3}$) 109 to a gate of a first adjust transistor 110, second adjust transistor 112, third adjust transistor 114, or fourth adjust transistor 116. The application of the offset voltage bit 109 to gate of one of these adjust transistors (110,112,114,116) produces a parallel combination of the resistor 106 with a first adjust resistor 118, second adjust resistor 120, third adjust resistor 122, or fourth adjust resistor 124, respectively. The parallel combination, which is presented to the positive input of the input adjust amplifier 126, results in the generation of the offset current ($I_{offset}$) through the input offset transistor 128, which will be a proportion of the temperature dependent gain control current ($I_{temp}$). The offset current ($I_{offset}$) is presented directly from the input offset transistor 128 to the inverting input (−) 36 of the operational amplifier 36. Therefore, the output voltage ($V_{out}$) will include an adjustable offset voltage which is directly dependent on the temperature dependent gain control current $I_{temp}$. Also included in $V_{out}$ is a supply dependent, temperature independent input offset voltage, originating in S+−S−, which is multiplied by the current $I_{temp}$. This implies that by adjusting the offset bits ($V_{x0}$, $V_{x1}$, $V_{x2}$, $V_{x3}$), $I_{offset}$ will generate an offset voltage at $V_{out}$ which will cancel the amplified input offset voltage at $V_{out}$ due to S+−S−. This cancellation is desired since input offsets multiplied by $I_{temp}$ would produce an undesirable temperature dependent offset voltage $V_{out}$. Since both offset voltages are dependent on $I_{temp}$, no change to this trimmed cancellation will result as $I_{temp}$ is varied by either gain calibration or temperature. It should be noted that three compensation transistors (132, 134, 136) are provided in order to duplicate the Rds on resistance effects of the adjust transistors (110, 112, 114, 116). Without the compensation transistors (132, 134, 136), excessive supply voltage ratiometric errors would result.

As previously indicated, the gain control current ($I_{temp}$) is presented to the multiplier input transistor 88. Specifically, $I_{temp}$ is presented to the multiplier input transistor 88 from the resistor 108 via the gain control transistor 130. With the base-to-emitter voltage of the multiplier input transistor 88 dependent upon the temperature dependent current ($I_{temp}$) injected into the collector of this transistor, the circuit gain can be selected by varying the temperature dependent gain current ($I_{temp}$). Furthermore, because the current ($I_{temp}$) is temperature dependent, the gain of the circuit will also be temperature dependent.

From the foregoing, it can be seen that a circuit and corresponding methodology is provided for integrated differential voltage amplification with programmable gain and input offset voltage that is able to sense positive and negative differential inputs. Furthermore, a multiplier is provided for amplifying a voltage difference using Bipolar Junction Transistor technology having high emitter resistance.

Those skilled in the art can now appreciate from this description that the broad teachings of the present invention can be implemented in a variety of forms. Therefore, the true scope of the invention is vast and other modifications will become apparent to the skilled practitioner upon studying of the drawings, specification, and following claims.

What is claimed is:

1. A multiplier, having a multiplier output voltage, for amplifying a voltage difference between a first input voltage and a second input voltage, the multiplier being implemented with Bipolar Junction Transistor technology having high emitter resistance, comprising:

a first bipolar input transistor having high emitter resistance, said first bipolar input transistor receiving the first input voltage;

a second bipolar input transistor having high emitter resistance, said second bipolar input transistor receiving the second input voltage;

a first current source for generating a first current that flows through said first bipolar input transistor;

a current mirnor, connected to the second bipolar input transistor, for producing a second current that is substantially equal to said first current and where said second current flows through said second bipolar input transistor;

a range select impedance, forming a first voltage loop with said first bipolar input transistor and said second bipolar input transistor for generating a range current based on said voltage difference, said range select current altering said first current which alters said second current produced by said current mirror thereby altering a base-to-emitter voltage of said second bipolar input transistor; and a second voltage loop including said second bipolar input transistor for generating a multiplier output current as a function of said base-to-emitter voltage of said second bipolar input transistor, said multiplier output current generating said multiplier output voltage which represents the difference between said first input voltage and said second input voltage.

2. The multiplier of claim 1, wherein said high emitter resistance is greater than 10 ohms and less than 40 ohms.

3. The multiplier of claim 2 which further comprises:

an offset current generating circuitry for providing an offset current which changes as a function of changes in temperature; and means for combining the offset current with the multiplier output current to generate the multiplier output voltage.

4. A method for amplifying a voltage difference between a first input voltage and a second input voltage utilizing Bipolar Junction Transistor technology having high emitter resistance, comprising:

receiving the first input voltage with a first bipolar input transistor having high emitter resistance;

receiving the second input voltage with a second bipolar input transistor having high emitter resistance;

generating a first current that flows through said first bipolar input transistor;

mirroring said first current such that a second current is produced that is substantially equal to said first current and where said second current flows through said second bipolar input transistor;

forming a first voltage loop with said first bipolar input transistor, said second bipolar input transistor and a range select impedance, said range select impedance generating a differential current based on said voltage difference, said range select current altering said first current which alters said second current thereby altering a base-to-emitter voltage of said second bipolar input transistor; and forming a second voltage loop, including said second bipolar input transistor, for generating a multiplier output current as a function of said base-to-emitter voltage of said second bipolar input transistor, said multiplier output current generating said multiplier output voltage which represent the difference between said first input voltage and said second input voltage.

5. The method of claim 4, wherein high emitter resistance is greater than 10 ohms and less than 40 ohms.

* * * * *